Oct. 11, 1955 J. J. SARDELLA 2,720,617
TRANSISTOR PACKAGES
Filed Nov. 2, 1953
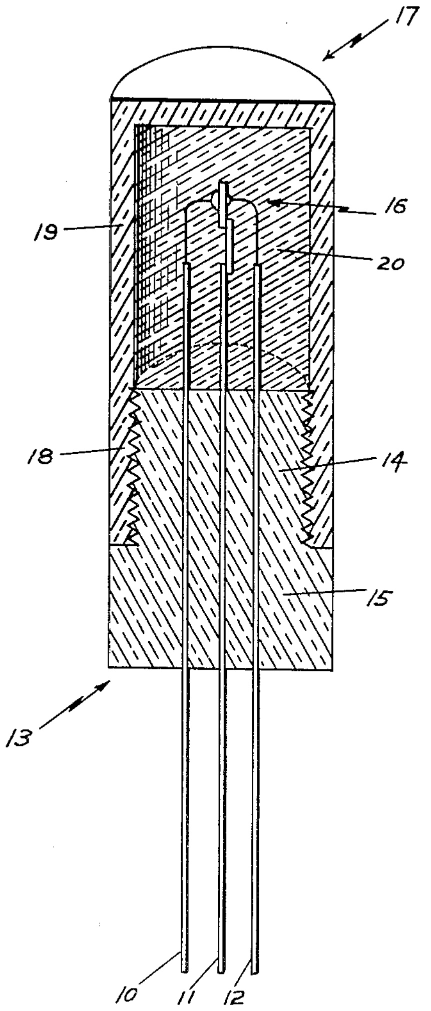
INVENTOR
JOHN J. SARDELLA
BY Elmer J. Gorn
ATTORNEY 2,720,617
Patented Oct. 11, 1955

2,720,617

TRANSISTOR PACKAGES

John J. Sardella, Jamaica Plain, Mass., assignor to Raytheon Manufacturing Company, Newton, Mass., a corporation of Delaware Application November 2, 1953, Serial No. 389,677

6 Claims. (Cl. 317—235)

This invention relates to a transistor package and more particularly to the use of polymeric fluorocarbons and polymeric substituted fluorocarbons as the materials employed to form the case for a transistor and the structure thereof.

In the final assembly of transistors, one of the primary objectives is to provide the transistor with a case which will give it maximum mechanical stability and protection from contaminants. It is well known that the semiconductor materials used in the manufacture of transistors are quite sensitive to heat, moisture, changes in humidity, oxidizing agents and the like. Therefore, the material which is used to cover the transistor components should be impervious to such ambient conditions and contaminants and, for the purposes of mass production, should be easily machined to form a suitable case.

It has been discovered that the polymeric fluorocarbons, such as polymeric tetrafluoroethylene and trifluorochloroethylene, are excellent materials which can be utilized to protect the transistor components. The coefficients of moisture absorption of these materials is zero, they are mechanically rugged, readily resist chemical contaminants, and can be easily machined to form a case for the transistor components. However, the electrical characteristics of transistors are greatly impaired if they are subjected to excessive heat and pressure, and the inherent physical properties of the polymeric fluorocarbons are such that it is not possible to directly cast the transistor components in the fluorocarbons without damaging them. Therefore, it is necessary to cast or form an outer shell or case of a polymeric fluorocarbon for the transistor components prior to encapsulating them. Furthermore, it is quite important to remove any atmospheric contaminants within the case when the transistor is encased. To accomplish this purpose it has been determined that the space separating the transistor components from the inner walls of the case can be filled with a suitable casting resin which in cooperation with the polymeric fluorocarbon case fully protects the transistor.

For example, one embodiment of this invention involves the use of a two-sectional cylindrical case made of polymeric tetrafluoroethylene in which the first section is a cylindrical envelope having an internal threading arrangement, and the second section is a threaded plug wherein the transistor leads are insulatedly mounted and extend therethrough and to which the transistor components are connected. Thus, the plug with the attached components can be screwed into the envelope, which has been previously filled with a liquid epoxy casting resin, and the entire assembly can be heated in an oven to cure the resin and seal the case. The finished package is small in size, mechanically rugged, highly resistive to external conditions, moisture proof and readily adaptable to mass production techniques.

This invention and the features thereof will be understood more clearly and fully from the following detailed description of one embodiment of the invention with reference to the accompanying drawing wherein a sectional view of a transistor package made in accordance with this invention is shown.

Referring now to the drawing, the transistor assembly includes three wire leads 10, 11 and 12 which are insulated from each other by supporting these leads and extending one of each of them through one of each of three holes drilled through a cylindrical plug 13. This plug has a threaded upper section 14 which is slightly smaller in diameter than the lower section 15 thereof. The leads can be made of dumet wire, for example, or any other suitable conducting material, but the plug 13 should be made of a polymeric fluorocarbon, and in this particular embodiment of the invention polymeric tetrafluoroethylene is used. However, it should be noted that polymeric substituted fluorocarbons, such as the trifluorochloroethylene polymer, for example, can be used as well. Thus, the transistor components 16 can be connected to each of the leads 10, 11 and 12, as shown, by techniques well known in the art. Although a diffused junction-type transistor is illustrated, the components 16 can be varied as desired and the transistor is not limited to any single type. Likewise, the leads can be increased or decreased in number to conform with the type of transistor being encapsulated.

The second section of the case is a cylindrical envelope 17, the internal diameter of which is substantially equal to the external diameter of the upper section 14 of the plug 13. A lower section 18 of the envelope is internally threaded so that the plug 13 can be inserted into the envelope and tightly threaded into place. Thus, the upper section 19 of the envelope is used to house the transistor components. The envelope 17 should also be made of polymeric tetrafluoroethylene and the remarks made above about substituting other polymeric fluorocarbons apply to the envelope as well. It should be noted that, prior to fitting the plug 13 into place, a suitable casting resin 20, such as an epoxy resin, for example, which affects transistor characteristics only slightly is poured into the upper section 19 of the envelope to a predetermined level. Thus, when the plug is rotated into position, the excess resin will fill any voids present in the envelope or around the leads, and transistor components are protected by completely compatible surroundings. The entire assembly is then placed in an oven which is heated to approximately sixty-five degrees centigrade and the resin is cured over a period of approximately two hours to complete the transistor package.

However, it should be understood that this invention is not limited to the particular details described above, as many equivalents will suggest themselves to those skilled in the art. For example, a spherical or rectangular-shaped envelope could be used as well as the cylindrical envelope described above. Likewise, in place of the threading arrangement utilized to seal the envelope, a press fitted plug could be used to close the envelope opening, and in the case of polymeric trifluorochloroethylene the leads can be injection molded in a plug of this material. Also, a hermetic seal can be effected with polymeric fluorocarbons and substituted fluorocarbons under pressure. Thus, an envelope formed in two pieces could be pressed together to provide a housing for the transistor and the plug could be eliminated. Furthermore, the casting resin can be varied as desired and the use of such resins is only restricted in that the one selected should not have a deleterious effect on transistor characteristics. Therefore, it is desired that the appended claims be given a broad interpretation commensurate with the scope of the invention within the art.

What is claimed is:

1. A transistor package comprising an envelope, a set of leads insulatedly sealed through said envelope, a transistor connected to said leads, said envelope having an interior closed chamber wherein said transistor is positioned in separated relation from said envelope, a casting resin filling said chamber and surrounding said transistor, said envelope being formed from a polymeric fluorocarbon.

2. A transistor package comprising an envelope, a set of leads insulatedly sealed through said envelope, a transistor connected to said leads, said envelope having an interior closed chamber wherein said transistor is positioned in separated relation from said envelope, a casting resin filling said chamber and surrounding said transistor, said envelope being formed from a polymeric substituted fluorocarbon.

3. A transistor package comprising an envelope, a set of leads insulatedly sealed through said envelope, a transistor connected to said leads, said envelope having an interior closed chamber wherein said transistor is positioned in separated relation from said envelope, a casting resin filling said chamber and surrounding said transistor, said envelope being formed of a material selected from the group consisting of polymeric tetrafluoroethylene and polymeric trifluorochloroethylene.

4. A transistor package comprising an envelope, a plug adapted to fit into and close the opening of said envelope, a set of leads insulatedly sealed through said plug, a transistor connected to said leads, said envelope being positioned over and separated from said transistor, a casting resin filling said envelope and surrounding said transistor, said envelope and said plug each being formed from a polymeric fluorocarbon.

5. A transistor package comprising an envelope, a plug adapted to fit into and close the opening of said envelope, a set of leads insulatedly sealed through said plug, a transistor connected to said leads, said envelope being positioned over and separated from said transistor, a casting resin filling said envelope and surrounding said transistor, said envelope and said plug each being formed from a polymeric substituted fluorocarbon.

6. A transistor package comprising an envelope, a plug adapted to fit into and close the opening of said envelope, a set of leads insulatedly sealed through said plug, a transistor connected to said leads, said envelope being positioned over and separated from said transistor, a casting resin filling said envelope and surrounding said transistor, said envelope and said plug each being formed of a material selected from the group consisting of polymeric tetrafluoroethylene and polymeric trifluorochloroethylene.

References Cited in the file of this patent

UNITED STATES PATENTS

| | | |
|---|---|---|
| 2,606,960 | Little | Aug. 12, 1952 |
| 2,664,528 | Stelmak | Dec. 29, 1953 |

OTHER REFERENCES

Rose: Abstract, Serial No. 223,547, September 8, 1953.